US007902918B2

(12) United States Patent
Yamamoto et al.

(10) Patent No.: US 7,902,918 B2
(45) Date of Patent: Mar. 8, 2011

(54) DEMODULATION APPARATUS, TEST APPARATUS AND ELECTRONIC DEVICE

(75) Inventors: Kazuhiro Yamamoto, Saitama (JP); Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 8 days.

(21) Appl. No.: 12/557,440

(22) Filed: Sep. 10, 2009

(65) Prior Publication Data
US 2010/0066443 A1 Mar. 18, 2010

Related U.S. Application Data

(63) Continuation of application No. PCT/JP2008/056238, filed on Mar. 28, 2008.

(30) Foreign Application Priority Data

Mar. 29, 2007 (JP) ................................. 2007-089692

(51) Int. Cl.
*H03D 1/00* (2006.01)
*H03D 3/02* (2006.01)
*G01R 25/00* (2006.01)

(52) U.S. Cl. ......... 329/360; 329/307; 329/345; 329/347; 702/79

(58) Field of Classification Search .................. 329/304, 329/306, 307, 345–348, 358, 360; 702/66, 702/79, 89
See application file for complete search history.

(56) References Cited

U.S. PATENT DOCUMENTS

| 4,517,531 A * | 5/1985 | Tan et al. ........................ 331/14 |
| 5,438,591 A * | 8/1995 | Oie et al. ...................... 375/261 |
| 5,533,059 A * | 7/1996 | Tsuda ............................ 375/327 |
| 5,583,785 A * | 12/1996 | Hainey ............................ 702/79 |
| 5,590,158 A * | 12/1996 | Yamaguchi et al. ........... 375/331 |
| 6,985,540 B2 * | 1/2006 | Nishikido ....................... 375/320 |
| 7,034,723 B2 * | 4/2006 | Suda et al. ...................... 341/122 |
| 2005/0110544 A1 | 5/2005 | Suda et al. |
| 2006/0109895 A1 | 5/2006 | Watanabe et al. |

FOREIGN PATENT DOCUMENTS

| JP | 2005-5769 A | 1/2005 |
| WO | 2005/050904 A1 | 6/2005 |

OTHER PUBLICATIONS

International Search Report (ISR) for PCT/JP2008/056238.
Written Option (PCT/ISA/237) of PCT/JP2008/056238.
Jain, "GHz Interconnects—Electrical Aspects", IEEE International Test Conference, NOTES Tutorial 3, p. 27, Oct. 22, 2006.

* cited by examiner

*Primary Examiner* — Robert Pascal
*Assistant Examiner* — Levi Gannon
(74) *Attorney, Agent, or Firm* — Chen Yoshimura LLP

(57) ABSTRACT

A demodulation apparatus that demodulates an amplitude-phase-modulated signal having a level and a transition phase selected from among a plurality of levels and a plurality of phases according to transmission data, comprising a clock recovering section that receives the amplitude-phase-modulated signal and recovers a clock signal synchronized with the amplitude-phase-modulated signal; an amplitude and phase detecting section that detects, with the clock signal as a reference, the level and the transition phase of the amplitude-phase-modulated signal; a data output section that outputs data corresponding to the level and the transition phase detected by the amplitude and phase detecting section; and a phase difference correcting section that outputs a correction signal for correcting an oscillation frequency of the clock signal output by the clock recovering section, according to the transition phase detected by the amplitude and phase detecting section.

14 Claims, 9 Drawing Sheets

US 7,902,918 B2

DEMODULATION APPARATUS, TEST APPARATUS AND ELECTRONIC DEVICE

CROSS REFERENCE TO RELATED APPLICATION

This is a continuation application of PCT/JP2008/56238 filed on Mar. 28, 2008 which claims priority from a Japanese Patent Application No. 2007-089692 filed on Mar. 29, 2007, the contents of which are incorporated herein by reference.

BACKGROUND

1. Technical Field

The present invention relates to a demodulation apparatus, a test apparatus, and an electronic device. In particular, the present invention relates to a demodulation apparatus that demodulates an amplitude-phase-modulated signal, and to a test apparatus and an electronic device for testing a device under test that outputs the amplitude-phase-modulated signal as an output signal.

2. Related Art

Along with an increase in the circuit density and operational speed of semiconductors, the amount of data transmitted within a semiconductor has also increased dramatically. However, the amount of data transmitted out from a semiconductor has not increased as much as the amount of data transmitted within the semiconductor due to restrictions on the number of pins, shape, wiring, and the like. This leads to a problem of an increased gap between the amount of data transmitted within the semiconductor and the amount of data transmitted outside of the semiconductor.

In Sunil Jain, "GHz Interconnects—Electrical Aspects", International Test Conference NOTES Tutorial 3, (US), Oct. 22, 2006, p. 27, a technique is disclosed for performing data transmission between semiconductors using an amplitude-phase-modulated signal having a transition phase and a level selected from among a plurality of transition phases and levels according to the transmitted data. With such an amplitude-phase-modulated signal, the multiple bits of data can be transmitted in a single period, thereby decreasing the gap between external and internal data transmission in a semiconductor.

In the case of a system that transmits an amplitude-phase-modulated signal without transmitting a clock signal in parallel, the receiving apparatus must recover the clock signal from the received amplitude-phase-modulated signal. However, the transition phase and the amplitude of the amplitude-phase-modulated signal fluctuates for each symbol according to the transmission data. Accordingly, even if the amplitude-phase-modulated signal is input as-is to the PLL, the clock signal output by the PLL will include an error caused by the phase fluctuation corresponding to the transmission data.

SUMMARY

Therefore, it is an object of an aspect of the innovations herein to provide a demodulation apparatus, a test apparatus, and an electronic device, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary demodulation apparatus may include a demodulation apparatus that demodulates an amplitude-phase-modulated signal having a level and a transition phase selected from among a plurality of levels and a plurality of phases according to transmission data, comprising a clock recovering section that receives the amplitude-phase-modulated signal and recovers a clock signal synchronized with the amplitude-phase-modulated signal; an amplitude and phase detecting section that detects, with the clock signal as a reference, the level and the transition phase of the amplitude-phase-modulated signal; a data Output section that outputs data corresponding to the level and the transition phase detected by the amplitude and phase detecting section; and a phase difference correcting section that outputs a correction signal for correcting an oscillation frequency of the clock signal output by the clock recovering section, according to the transition phase detected by the amplitude and phase detecting section.

According to a second aspect related to the innovations herein, one exemplary test apparatus may include a test apparatus for testing a device under test that outputs, as an output signal, an amplitude-phase-modulated signal having a level and a transition phase selected from among a plurality of levels and a plurality of phases according to transmission data, comprising a test signal output section that outputs a test signal to the device under test; a pattern generating section that generates an expected level, which is an expected value of a level of the output signal that should be output from the device under test in response to the test signal, and an expected phase, which is an expected value of a transition phase of the output signal; a clock recovering section that receives the amplitude-phase-modulated signal from the device under test and recovers a clock signal synchronized with the amplitude-phase-modulated signal; an amplitude and phase detecting section that detects, with the clock signal as a reference, the level and the transition phase of the output signal; a data output section that outputs data corresponding to the level and the transition phase detected by the amplitude and phase detecting section; a judging section that judges whether the level and the transition phase detected by the detecting section match the expected level and the expected phase; and a phase difference correcting section that outputs a correction signal for correcting an oscillation frequency of the clock signal output by the clock recovering section, according to the transition phase detected by the amplitude and phase detecting section.

According to a third aspect related to the innovations herein, one exemplary electronic device may comprise a circuit under test that outputs, as an output signal, an amplitude-phase-modulated signal having a level and a transition phase selected from among a plurality of levels and a plurality of phases according to transmission data; and a test circuit that tests the circuit under test. The test circuit includes a test signal output section that outputs a test signal to the circuit under test; a pattern generating section that generates an expected level, which is an expected value of a level of the output signal that should be output from the circuit under test in response to the test signal, and an expected phase, which is an expected value of a transition phase of the output signal; a clock recovering section that receives the amplitude-phase-modulated signal from the circuit under test and recovers a clock signal synchronized with the amplitude-phase-modulated signal; an amplitude and phase detecting section that detects, with the clock signal as a reference, the level and the transition phase of the output signal; a judging section that judges whether the level and the transition phase detected by the detecting section match the expected level and the expected phase; and a phase difference correcting section that outputs a correction signal for correcting an oscillation frequency of the clock signal output by the clock recovering section, according to the transition phase detected by the amplitude and phase detecting section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
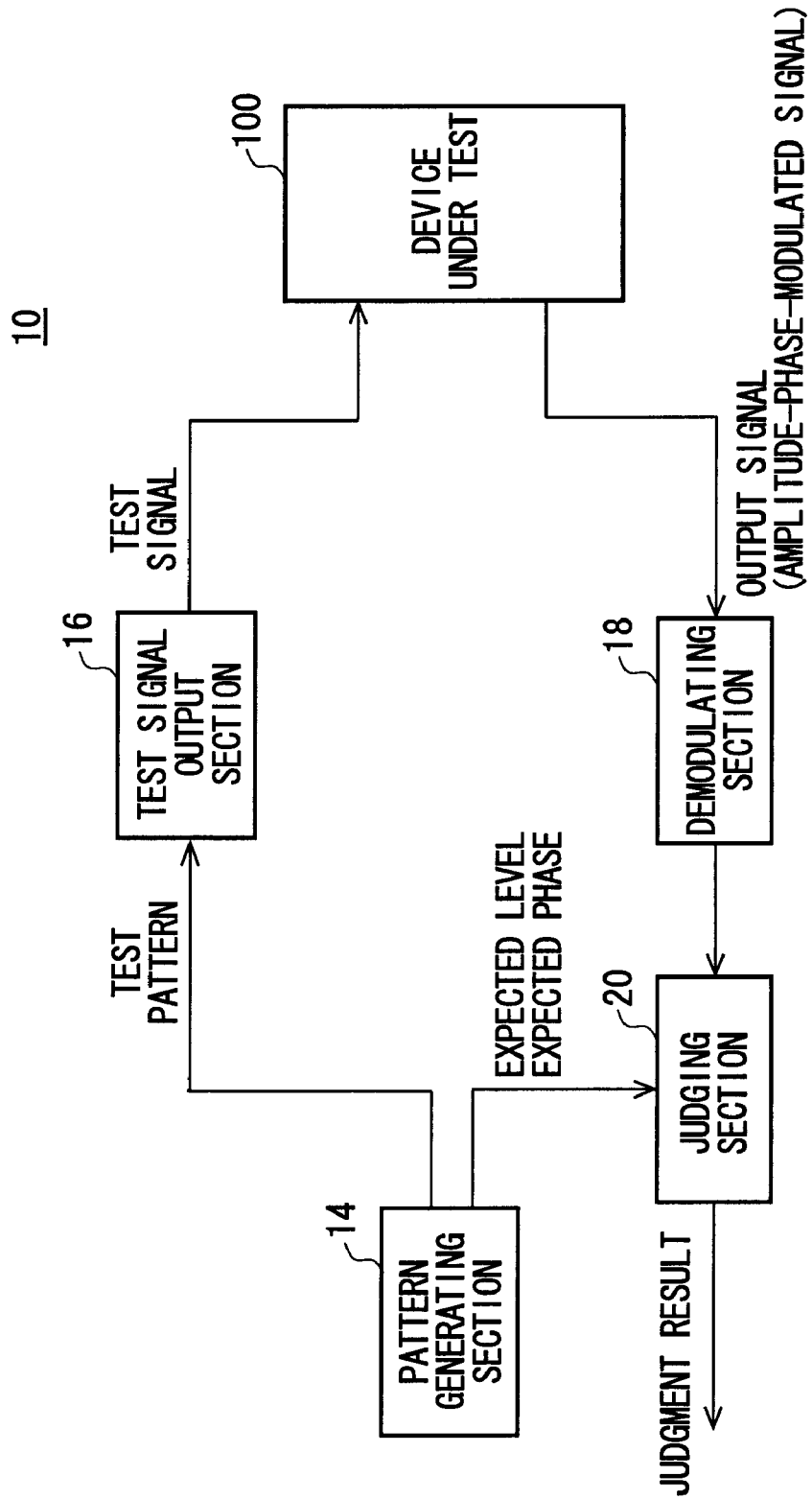
FIG. 1 shows an exemplary configuration of a test apparatus 10 according to an embodiment of the present invention, along with a device under test 100.
Figure 2:
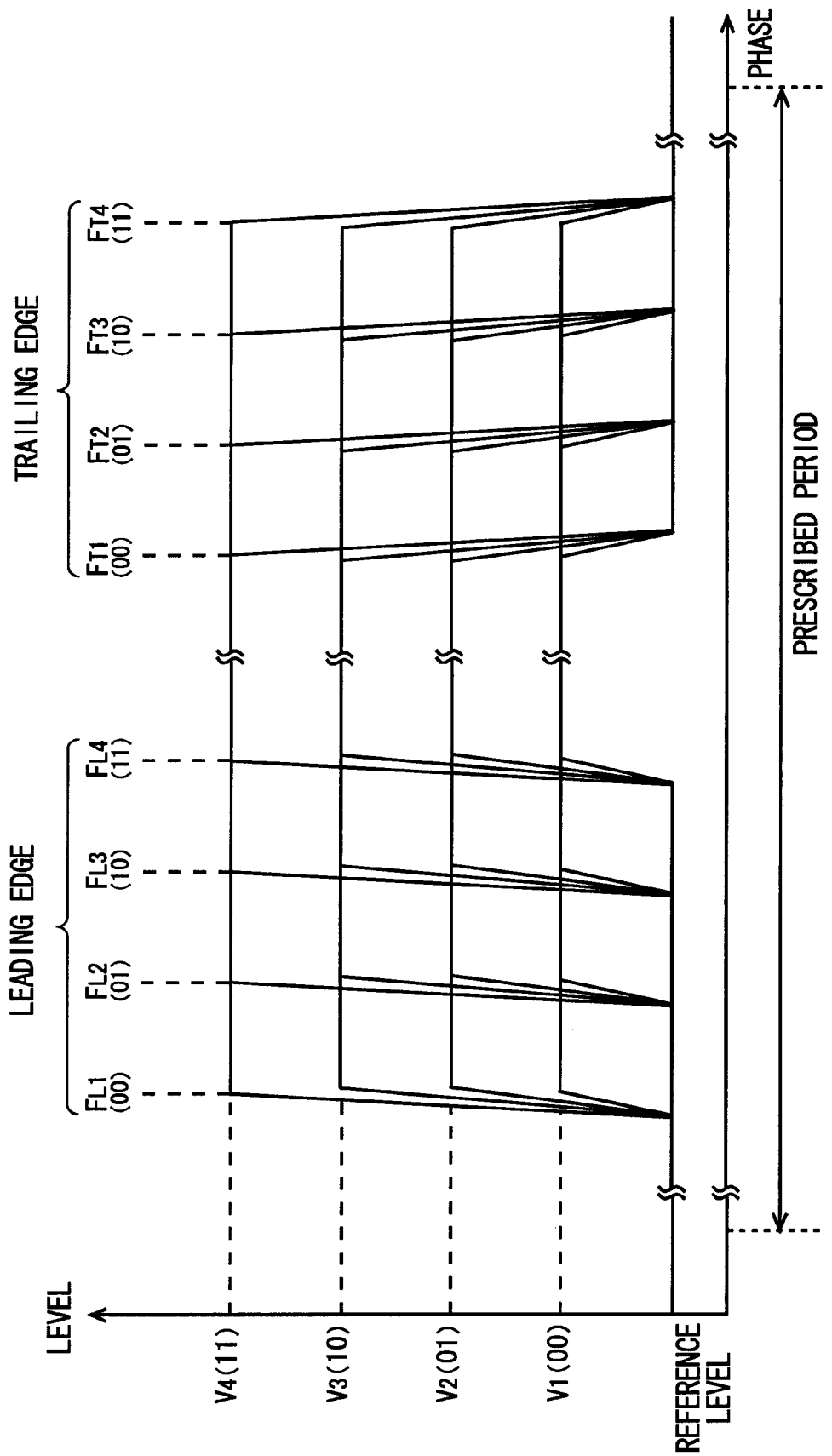
FIG. 2 shows an exemplary amplitude-phase-modulated signal according to the present embodiment.

FIG. 1 shows an exemplary configuration of a test apparatus 10 according to an embodiment of the present invention, along with a device under test 100. FIG. 2 shows an exemplary amplitude-phase-modulated signal according to the present embodiment.

The test apparatus 10 tests the device under test 100 by outputting, as an output signal, an amplitude-phase-modulated signal having a transition phase and a level selected from among a plurality of phases and levels according to transmission data. The device under test 100 may output an amplitude-phase-modulated signal that is a pulse signal synchronized with a prescribed period and having a pulse level and pulse edge phase that changes according to the transmission data. In other words, the device under test 100 may output an amplitude-phase-modulated signal that has, for each period, a pulse level selected from among a plurality of predetermined levels according to the transmission data. Furthermore, the device under test 100 may output an amplitude-phase-modulated signal in which the transition phase of at least one of a leading edge and a trailing edge in each period is selected from a plurality of predetermined phases within the period according to the transmission data.

For example, the device under test 100 may output an amplitude-phase-modulated signal that can take any one of $n_1$ levels $(V_1, V_2, V_3, \ldots, V_{n1})$ as the pulse level for each period, where $n_1$ is an integer greater than 1. The device under test 100 may output an amplitude-phase-modulated signal that can take any one of $n_2$ phases $(F_{L1}, F_{L2}, F_{L3}, \ldots, F_{Ln2})$ as the phase of the leading edge of the pulse for each period, where $n_2$ is an integer greater than 1. The device under test 100 may output an amplitude-phase-modulated signal that can take any one of $n_3$ phases $(F_{T1}, F_{T2}, F_{T3}, \ldots, F_{Tn2})$ as the phase of the trailing edge of the pulse for each period, where $n_3$ is an integer greater than 1.

By outputting the amplitude-phase-modulated signal described above, multivalued data can be transmitted in each prescribed period. For example, an amplitude-phase-modulated signal that can have $n_1$ levels, $n_2$ leading edge phases, and $n_3$ trailing edge phases can transmit data having $(n_1 \times n_2 \times n_3)$ values in a single period.

The test apparatus 10 is provided with a pattern generating section 14, a test signal output section 16, a demodulating section 18, and a judging section 20. The pattern generating section 14 generates a test pattern that designates a pattern of the test signal to be output to the device under test 100. The pattern generating section 14 also generates an expected value of the output signal, i.e. the amplitude-phase-modulated signal, that is expected to be output by the device under test 100 in response to the test signal. In other words, the pattern generating section 14 generates an expected level, which is the expected value of the level of the output signal to be output from the device under test 100 in response to the test signal, and an expected phase, which is the expected transition phase of the output signal from the device under test 100. For example, the pattern generating section 14 may generate, for each pulse generated in a prescribed period, an expected level, an expected phase of the leading edge, and an expected phase of the trailing edge.

The test signal output section 16 generates the test signal according to the test pattern and the reference signal, and outputs the generated test signal to the device under test 100. The demodulating section 18 receives the output signal output from the device under test 100 in response to the test signal, and detects the level and transition phase of the received output signal. The judging section 20 judges whether the level and transition phase detected by the demodulating section 18 match the expected level and expected phase. The judging section 20 outputs the judgment result.

Figure 3:
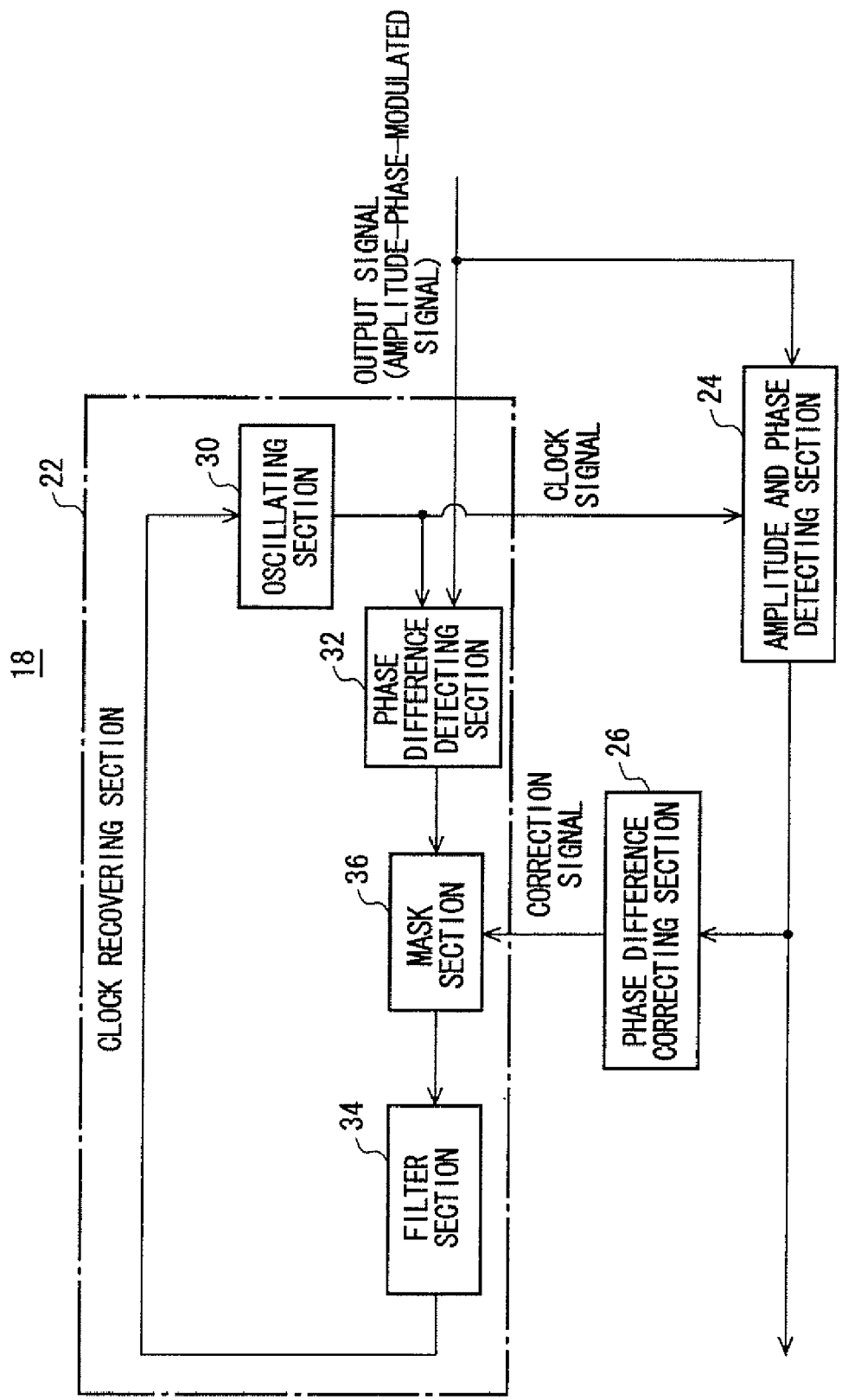
FIG. 3 shows a configuration of the demodulating section 18 according to the present embodiment.

FIG. 3 shows a configuration of the demodulating section 18 according to the present embodiment. The demodulating section 18 includes a clock recovering section 22, an amplitude and phase detecting section 24, and a phase difference correcting section 26.

The clock recovering section 22 receives the output signal, i.e. the amplitude-phase-modulated signal output from the device under test 100, and recovers a clock signal synchronized with the received output signal. The clock recovering section 22 includes an oscillating section 30, a phase difference detecting section 32, a filter section 34, and a mask section 36.

The oscillating section 30 outputs a clock signal having a frequency corresponding to a control signal supplied thereto. The phase difference detecting section 32 detects a phase difference between the output signal and the clock signal.

The filter section 34 supplies the oscillating section 30 with a control signal corresponding to the phase difference. For example, the filter section 34 low-pass filters the phase difference detected by the phase difference detecting section 32, and supplies the oscillating section 30 with the resulting signal as the control signal.

The mask section 36 masks the phase difference supplied from the phase difference detecting section 32 to the filter section 34, according to a correction signal output form the phase difference correcting section 26. More specifically, the mask section 36 supplies the filter section 34 with the phase difference detected by the phase difference detecting section 32 on a condition that a mask is designated by the correction signal, and does not supply the filter section 34 with the phase difference detected by the phase difference detecting section 32 on a condition that a mask is designated by the correction signal. When masking, the mask section 36 may supply the filter section 34 with a phase difference of 0, or may supply the filter section 34 with the phase difference detected by the phase difference detecting section 32 immediately prior to the masking.

The clock recovering section 22 with the configuration described above can cause the oscillating section 30 to change the frequency of the clock signal according to the level of the control signal output from the filter section 34. When in a steady state, the clock recovering section 22 can output a clock signal having a frequency that causes the level of the control signal to be 0. As a result, the clock recovering section 22 can output a clock signal having a phase difference with a temporal average of 0 with respect to the output signal, that is, a clock signal that is synchronized with the output signal.

The amplitude and phase detecting section 24 detects the level and transition phase of the output signal using the clock signal recovered by the clock recovering section 22 as a reference. For example, the amplitude and phase detecting section 24 may detect the level of the output signal from among a plurality of possible levels of the output signal for each period designated by the clock signal. Furthermore, the amplitude and phase detecting section 24 may detect the leading edge phase from among a plurality of possible leading edge phases of the output signal, and detect the trailing edge phase from among a plurality of possible trailing edge phases of the output signal.

The phase difference correcting section 26 corrects the phase difference supplied from the phase difference detecting section 32 to the filter section 34, according to the transition phase detected by the amplitude and phase detecting section 24. In the present embodiment, the phase difference correcting section 26 corrects the phase difference supplied from the phase difference detecting section 32 to the filter section 34 by outputting, to the mask section 36, the correction signal that designates whether masking is to be performed on the phase difference supplied from the phase difference detecting section 32 to the filter section 34.

For example, the phase difference correcting section 26 may supply the filter section 34 with the phase difference detected by the phase difference detecting section 32 on a condition that the transition phase detected by the amplitude and phase detecting section 24 is at least one predetermined phase from among the plurality of possible phases of the output signal. In other words, the phase difference correcting section 26 may mask the phase difference supplied from the phase difference detecting section 32 to the filter section 34 on a condition that the transition phase detected by the amplitude and phase detecting section 24 is not at least one predetermined phase from among the plurality of possible phases of the output signal.

In this way, the phase difference correcting section 26 can cause the oscillating section 30 to output a clock signal that is synchronized only with a predetermined transition phase. Accordingly, the clock recovering section 22 can output a clock signal that is accurately synchronized with the output signal, which is an amplitude-phase-modulated signal, by eliminating the error caused by phase fluctuation corresponding to the transmission data.

Furthermore, the phase difference correcting section 26 may supply the filter section 34 with the phase difference detected by the phase difference detecting section 32 on a condition that the level and transition phase detected by the amplitude and phase detecting section 24 are each at least one predetermined level and phase from among the plurality of possible levels and phases of the output signal. In other words, the phase difference correcting section 26 may mask the phase difference supplied from the phase difference detecting section 32 to the filter section 34 on a condition that either the level or the transition phase detected by the amplitude and phase detecting section 24 is not at least one predetermined level and phase from among the plurality of possible levels and phases of the output signal.

Depending on how steep the rising or falling waveform of the amplitude-phase-modulated signal is, even within the same phase, the transition point that is actually detected may be delayed more for a high level than for a low level. Accordingly, the phase difference correcting section 26 can further eliminate the error caused by phase fluctuation corresponding to the transmission data by causing the oscillating section 30 to output a clock signal synchronized only with predetermined levels and transition phases.

Figure 4:
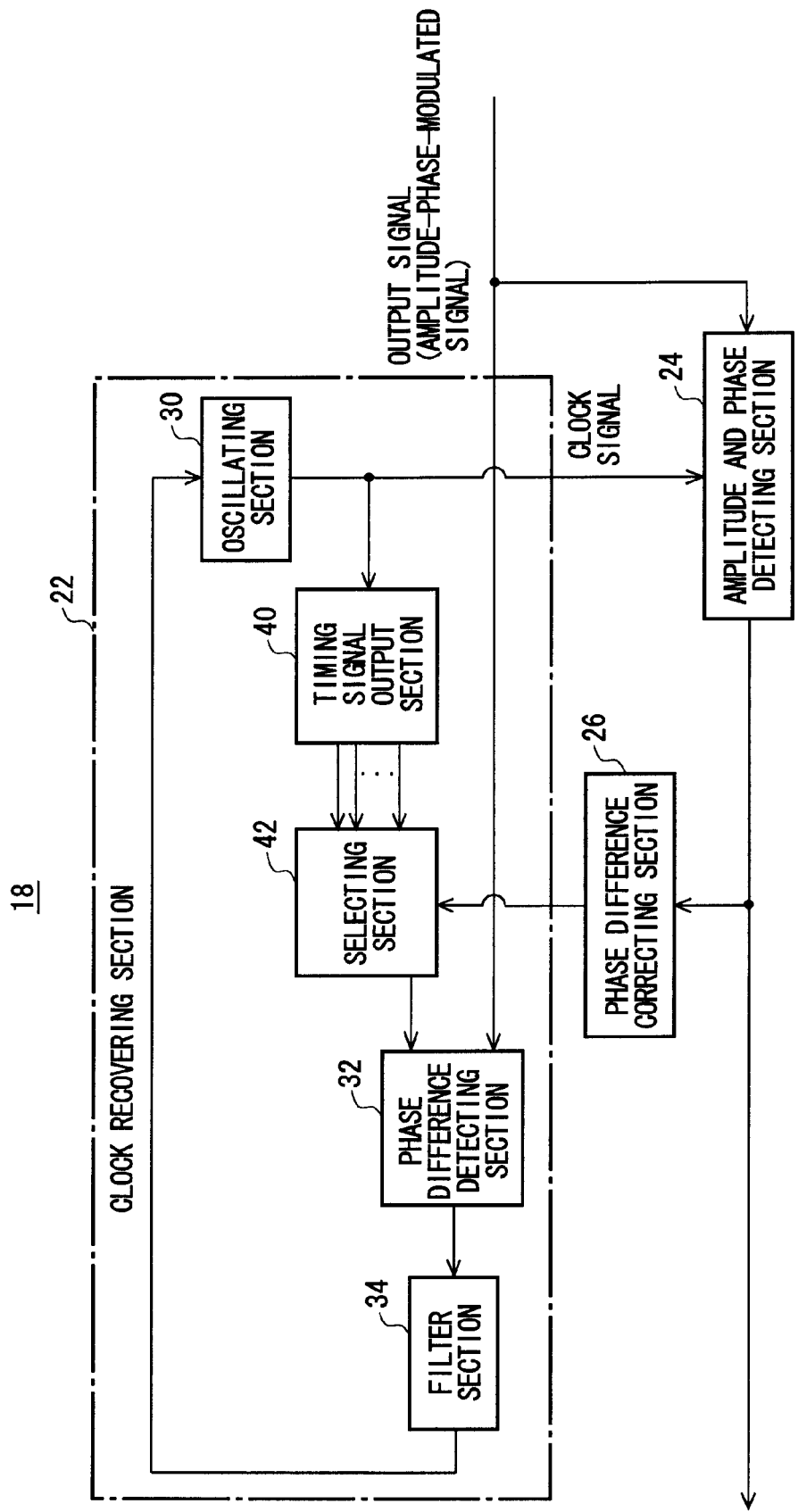
FIG. 4 shows a configuration of the demodulating section 18 according to a first modification of the present invention.

FIG. 4 shows a configuration of the demodulating section 18 according to a first modification of the present invention. The demodulating section 18 of the present modification adopts the same function and configuration as the demodulating section 18 shown in FIG. 3, and components of the present modification adopt the same function and configuration as components having the same reference numeral in FIG. 3. Therefore, the following description includes only differing points.

The clock recovering section 22 includes a timing signal output section 40 and a selecting section 42, instead of the mask section 36. The timing signal output section 40 generates, based on the clock signal, a plurality of timing signals that correspond respectively to a plurality of possible transition phases of the output signal. In other words, when the clock signal and the output signal are in a steady and synchronized state, the timing signal output section 40 generates, based on the clock signal, a plurality of timing signals synchronized with a plurality of possible phases of the output signal.

For example, the timing signal output section 40 may include a plurality of delay elements connected in series to sequentially delay the clock signal. The timing signal output section 40 outputs, as the timing signals, the signals output from each of the plurality of delay elements. In this way, the timing signal output section 40 can output a plurality of timing signal corresponding to the possible transition phases of the output signal. If the oscillating section 30 includes a ring buffer, the timing signal output section 40 may output, as the timing signal, the signals output from each buffer forming the ring buffer of the oscillating section 30.

The selecting section 42 selects one timing signal from among the timing signals output from the timing signal output section 40, according to a selection signal output by the phase difference correcting section 26, and supplies the phase difference detecting section 32 with the selected timing signal. The phase difference detecting section 32 detects the phase difference between the output signal and the timing signal selected by the selecting section 42.

The phase difference correcting section 26 selects, from among the plurality of timing signals, the timing signal that corresponds to the transition phase detected by the amplitude and phase detecting section 24. In the present modification, the phase difference correcting section 26 selects the timing signal by supplying the selecting section 42 with the selection signal designating which timing signal from among the timing signal output by the timing signal output section 40 is supplied to the phase difference detecting section 32.

In this way, the clock recovering section 22 detects the phase difference between the output signal and the timing signal that is synchronized with the transition phase of the output signal, and can therefore detect a phase difference from which is eliminated the error caused by the phase fluctuation corresponding to the transmission data. Accordingly, the clock recovering section 22 can remove the error caused by phase fluctuation corresponding to the transmission data, thereby enabling output of a clock signal that is accurately synchronized with the output signal, which is an amplitude-phase-modulated signal.

In the present modification, the phase difference detecting section 32 may delay the received output signal by an amount according to a process of the amplitude and phase detecting section 24, and detect the phase difference between the output signal and the selected timing signal. In this way, the phase difference detecting section 32 can cause the symbol of the received output signal to match the symbol of the output signal serving as the basis for the selection of the timing signal by the phase difference correcting section 26, and then detect the phase difference.

The clock recovering section 22 may include a variable delay element instead of the selecting section 42 and the timing signal output section 40. In this case, the phase difference correcting section 26 outputs the plurality of timing signals synchronized respectively with the plurality of possible phases of the output signal by controlling the delay amount of the variable delay circuit according to the transition phase detected by the amplitude and phase detecting section 24.

Figure 5:
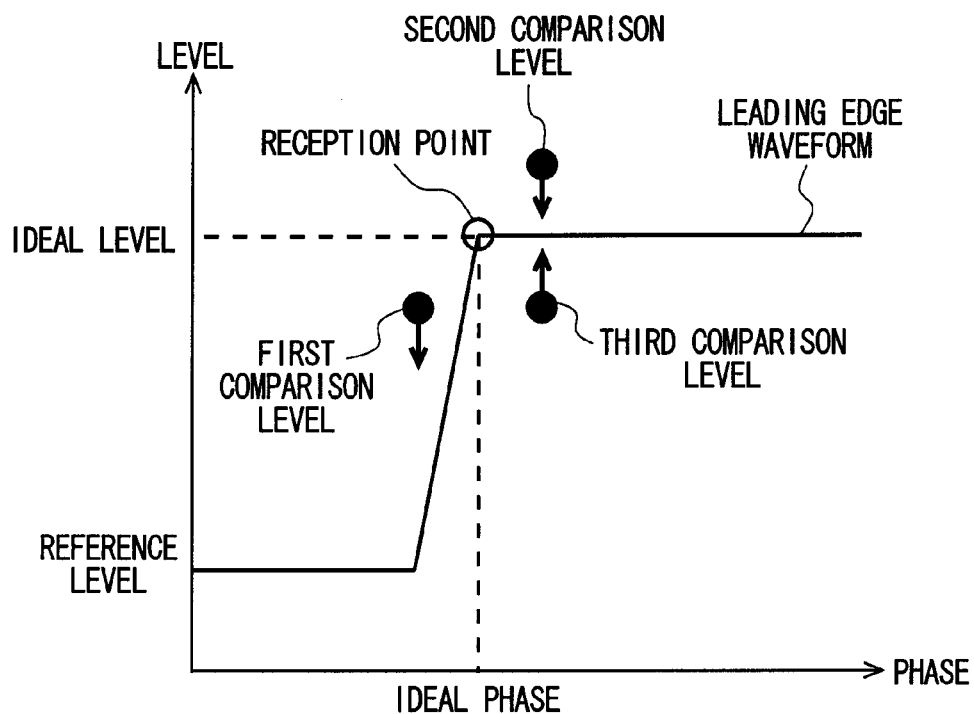
FIG. 5 shows examples of comparison levels and comparison timings corresponding to one arbitrary reception point, when the demodulating section 18 of the present embodiment detects the level and the transition (leading edge) phase of the output signal.

FIG. 5 shows examples of comparison levels and comparison timings corresponding to one arbitrary reception point, when the amplitude and phase detecting section 24 of the present embodiment detects the level and the transition (leading edge) phase of the output signal. When modulating data with the level and leading edge phase of the output signal, the amplitude and phase detecting section 24 may preset first to third comparison levels shown in FIG. 5 corresponding to reception points having respective combinations of a plurality of possible levels and possible transition (leading edge) phases of the output signal. When modulating data with the leading edge phase of the output signal, the amplitude and phase detecting section 24 may, for each of the plurality of reception points in each period, compare the output signal to the first comparison level that is lower than an ideal level of the reception point and that has a phase earlier than the ideal phase of the reception point, and also compare the output signal to the second comparison level that is higher than the ideal level of the reception point and to a third comparison level that is lower than the ideal level of the reception point, where both the second and third comparison levels are at a phase later than the ideal phase of the reception point.

Here, the amplitude and phase detecting section 24 compares the output signal to the first comparison level before the ideal phase of the reception point, and therefore detects that the output signal is less than the ideal level of the reception point prior to the ideal phase of the reception point. Furthermore, the amplitude and phase detecting section 24 compares the output signal to the third comparison level after the ideal phase of the reception point, and therefore detects that the output signal is greater than or equal to the ideal level of the reception point after the ideal phase of the reception point. Accordingly, the amplitude and phase detecting section 24 can detect, for each of the plurality of possible reception points of the leading edge of the output signal, whether the phase of the output signal matches the ideal phase, which is a phase that is later than the comparison timing of the first comparison level and earlier than the comparison timing of the third comparison level.

The amplitude and phase detecting section 24 compares the output signal to the second comparison level after the ideal phase of the reception point, along with comparing the output signal to the third comparison level after the ideal phase of the reception point. Accordingly, the amplitude and phase detecting section 24 can detect, for each of the possible reception points of the output signal, whether the level of the output signal substantially matches the ideal level, which is no greater than the second comparison level and no less than the third comparison level.

The amplitude and phase detecting section 24 can detect the level and leading edge phase of the output signal based on the plurality of comparison results for each of the possible reception points of the output signal. In other words, the amplitude and phase detecting section 24 detects one reception point, from among a plurality of reception points, that has a level no greater than the first comparison level before the ideal phase, and no greater than the second comparison level and no less than the third comparison level after the ideal phase. The amplitude and phase detecting section 24 then outputs, as the level and the transition phase of the output signal, the ideal level and the ideal phase of the one detected reception point.

The first comparison level and the third comparison level are desirably less than the ideal level of the reception point and greater than a level that is one level below the ideal level of the reception point from among the plurality of possible levels of the output signal. The comparison timing of the first comparison level is desirably before the ideal phase of the reception point of the leading edge and after a phase that is immediately prior to the ideal phase of the reception point from among the plurality of possible phases of the leading edge. For example, the amplitude and phase detecting section 24 may compare the output signal to the first comparison level and the third comparison level, which is substantially the same as the first comparison level, after the ideal phase of the reception point. In this way, the amplitude and phase detecting section 24 can use a common comparison circuit.

The second comparison level is desirably greater than the ideal level of the reception point and less than a level that is one level above the ideal level of the reception point from among the plurality of levels of the output signal. The comparison timing of the second comparison level and the third comparison level is desirably after the ideal phase of the reception point of the leading edge and before a phase that immediately follows the ideal phase of the reception point from among the plurality of possible phases of the leading edge. For example, the amplitude and phase detecting section 24 may compare the output signal to the second comparison level and the third comparison level at substantially the same timing after the ideal phase of the reception point. In this way, the amplitude and phase detecting section 24 can use a common comparison timing circuit.

In the present embodiment, when the first level is described as being greater than or equal to the second level, this means that the absolute value of the difference between the reference level, e.g. a ground, and the first level is greater than or equal to the absolute value of the difference between the reference level and the second level. Accordingly, when the output signal is described as being greater than or equal to a comparison level, this means that the absolute value of the difference between the reference level and the output signal is greater than or equal to the absolute value of the difference between the reference level and the comparison level. In the same way, when the first level is described as being less than or equal to the second level, this means that the absolute value of the difference between the reference level and the first level is less than or equal to the absolute value of the difference between the reference level and the second level.

Figure 6:
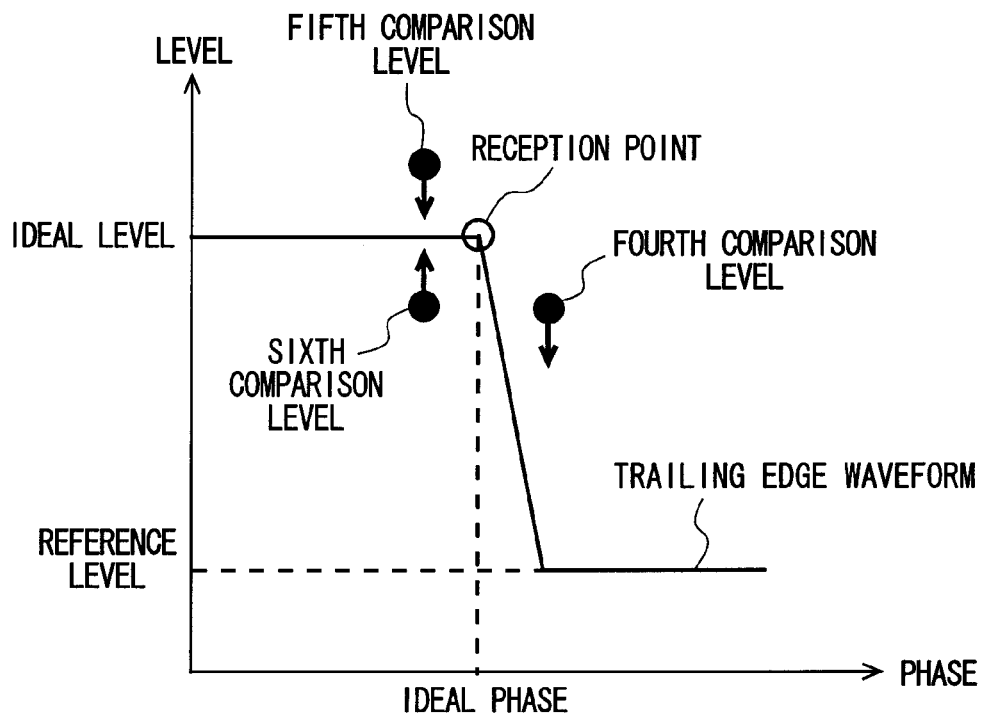
FIG. 6 shows examples of comparison levels and comparison timings corresponding to one arbitrary reception point, when the amplitude and phase detecting section 24 of the present embodiment detects the level and the transition (trailing edge) phase of the output signal.

FIG. 6 shows examples of comparison levels and comparison timings corresponding to one arbitrary reception point, when the amplitude and phase detecting section 24 of the present embodiment detects the level and the transition (trailing edge) phase of the output signal. When modulating data with the level and trailing edge phase of the output signal, the amplitude and phase detecting section 24 may preset fourth to sixth comparison levels to correspond to the reception point having respective combinations of a plurality of possible levels (ideal levels) and possible transition (trailing edge) phases (ideal phases) of the output signal. When modulating data with the trailing edge phase of the output signal, the amplitude and phase detecting section 24 may, for each of the plurality of reception points in each period, compare the output signal to the fourth comparison level that is lower than an ideal level of the reception point and that has a phase later than the ideal phase, and also compare the output signal to the fifth comparison level that is higher than the ideal level of the reception point and to the sixth comparison level that is lower than the ideal level of the reception point, where both the fifth and sixth comparison levels are at a phase earlier than the ideal phase of the reception point.

Here, the amplitude and phase detecting section 24 compares the output signal to the fourth comparison level after the ideal phase of the reception point, and therefore detects that the output signal is less than the ideal level of the reception point after the ideal phase of the reception point. Furthermore, the amplitude and phase detecting section 24 compares the output signal to the sixth comparison level before the ideal phase of the reception point, and therefore detects that the output signal is greater than or equal to the ideal level of the reception point before the ideal phase of the reception point. Accordingly, the amplitude and phase detecting section 24 can detect, for each of the plurality of possible reception points of the trailing edge of the output signal, whether the phase of the output signal substantially matches the ideal phase, which is a phase that is earlier than the comparison timing of the sixth comparison level and later than the comparison timing of the fourth comparison level.

The amplitude and phase detecting section 24 compares the output signal to the fifth comparison level before the ideal phase of the fifth point, along with comparing the output signal to the sixth comparison level before the ideal phase of the reception point. Accordingly, the amplitude and phase detecting section 24 can detect, for each of the possible reception points of the output signal, whether the level of the output signal substantially matches the ideal level, which is no greater than the fifth comparison level and no less than the sixth comparison level.

The amplitude and phase detecting section 24 can detect the level and trailing edge phase of the output signal based on the plurality of comparison results for each of the possible reception points of the output signal. In other words, the amplitude and phase detecting section 24 detects, from among a plurality of reception points, one reception point that has a level no greater than the fourth comparison level after the ideal phase, and no greater than the fifth comparison level and no less than the sixth comparison level before the ideal phase of the reception point. The amplitude and phase detecting section 24 then outputs, as the level and the transition phase of the output signal, the ideal level and the ideal phase of the one detected reception point.

The fourth comparison level and the sixth comparison level are desirably less than the ideal level of the reception point and greater than a level that is one level below the ideal level of the reception point from among the plurality of possible levels of the output signal. The comparison timing of the fourth comparison level is desirably after the ideal phase of the reception point of the trailing edge and before a phase that immediately follows the ideal phase of the reception point from among the plurality of possible phases of the trailing edge. For example, the amplitude and phase detecting section 24 may compare the output signal to the fourth comparison level and the sixth comparison level, which is substantially the same as the fourth comparison level, before the ideal phase of the reception point. In this way, the amplitude and phase detecting section 24 can use a common comparison circuit.

The fifth comparison level is desirably greater than the ideal level of the reception point and less than a level that is one level above the ideal level of the reception point from among the plurality of level of the output signal. The comparison timing of the fifth comparison level and the sixth comparison level is desirably before the ideal phase of the reception point of the trailing edge and after a phase that is immediately prior to the ideal phase of the reception point from among the plurality of possible phases of the trailing edge. For example, the amplitude and phase detecting section 24 may compare the output signal to the fifth comparison level and the sixth comparison level at substantially the same timing before the ideal phase of the reception point. In this way, the amplitude and phase detecting section 24 can use a common comparison timing circuit.

Figure 7:
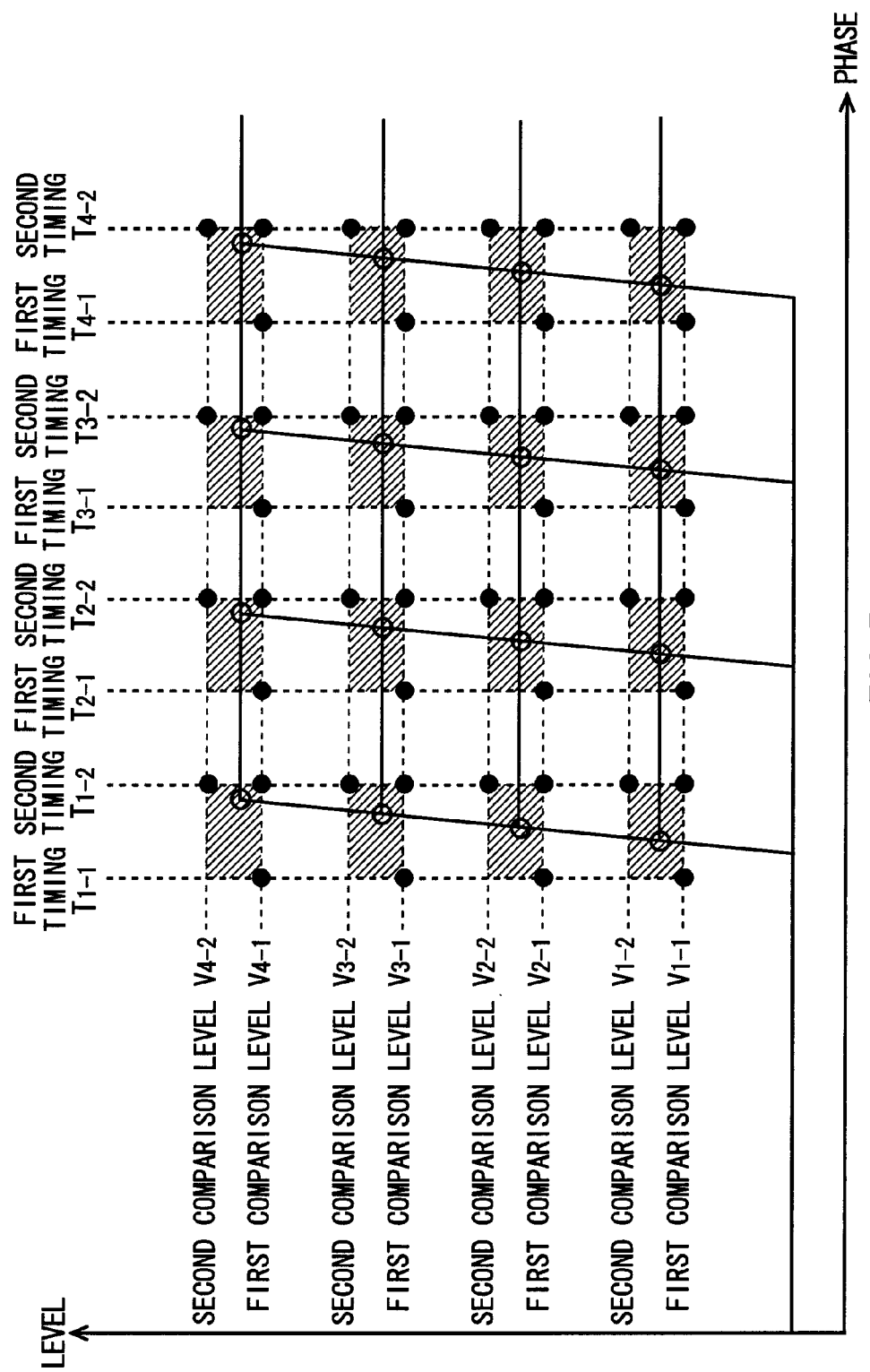
FIG. 7 shows exemplary comparison levels and comparison timings corresponding respectively to various combinations of possible levels and transition phases of the amplitude-phase-modulated signal.

FIG. 7 shows exemplary comparison levels and comparison timings corresponding respectively to various combinations of possible levels and transition phases of the amplitude-phase-modulated signal. The amplitude and phase detecting section 24 may set, in substantially the same phase, a plurality of first (or fourth) comparison levels corresponding to a plurality of reception points with different levels but the same transition phase. The amplitude and phase detecting section 24 may set, in substantially the same phase, a plurality of second (or fifth) comparison levels corresponding to a plurality of reception points with different levels but the same transition phase. The amplitude and phase detecting section 24 may set, in substantially the same phase, a plurality of third (or sixth) comparison levels corresponding to a plurality of reception points with different levels but the same transition phase.

The amplitude and phase detecting section 24 may set, at substantially the same level, a plurality of first (or fourth) comparison levels corresponding to a plurality of reception points with different phases but the same level. The amplitude and phase detecting section 24 may set, at substantially the same level, a plurality of second (or fifth) comparison levels corresponding to a plurality of reception points with different phases but the same level. The amplitude and phase detecting section 24 may set, at substantially the same level, a plurality of third (or sixth) comparison levels corresponding to a plurality of reception points with different phases but the same level. The amplitude and phase detecting section 24 having such a configuration can use a common level comparing circuit and a common comparison timing control circuit.

For a pair of reception points that have the same transition phase and that have adjacent levels, the amplitude and phase detecting section 24 may set the second (or fifth) comparison level of the reception point corresponding to the upper level to be substantially the same as the third (or sixth) comparison level of the reception point corresponding to the lower level, for example. For a pair of reception points that have the same level and that have adjacent phases, the amplitude and phase detecting section 24 may set the comparison timing of the third (or fourth) comparison level of the reception point corresponding to the earlier phase to be substantially the same as the comparison timing of the first (or sixth) comparison level of the reception point corresponding to the later phase, for example. In this way, the amplitude and phase detecting section 24 can cause even more of the circuits to be used commonly.

Figure 8:
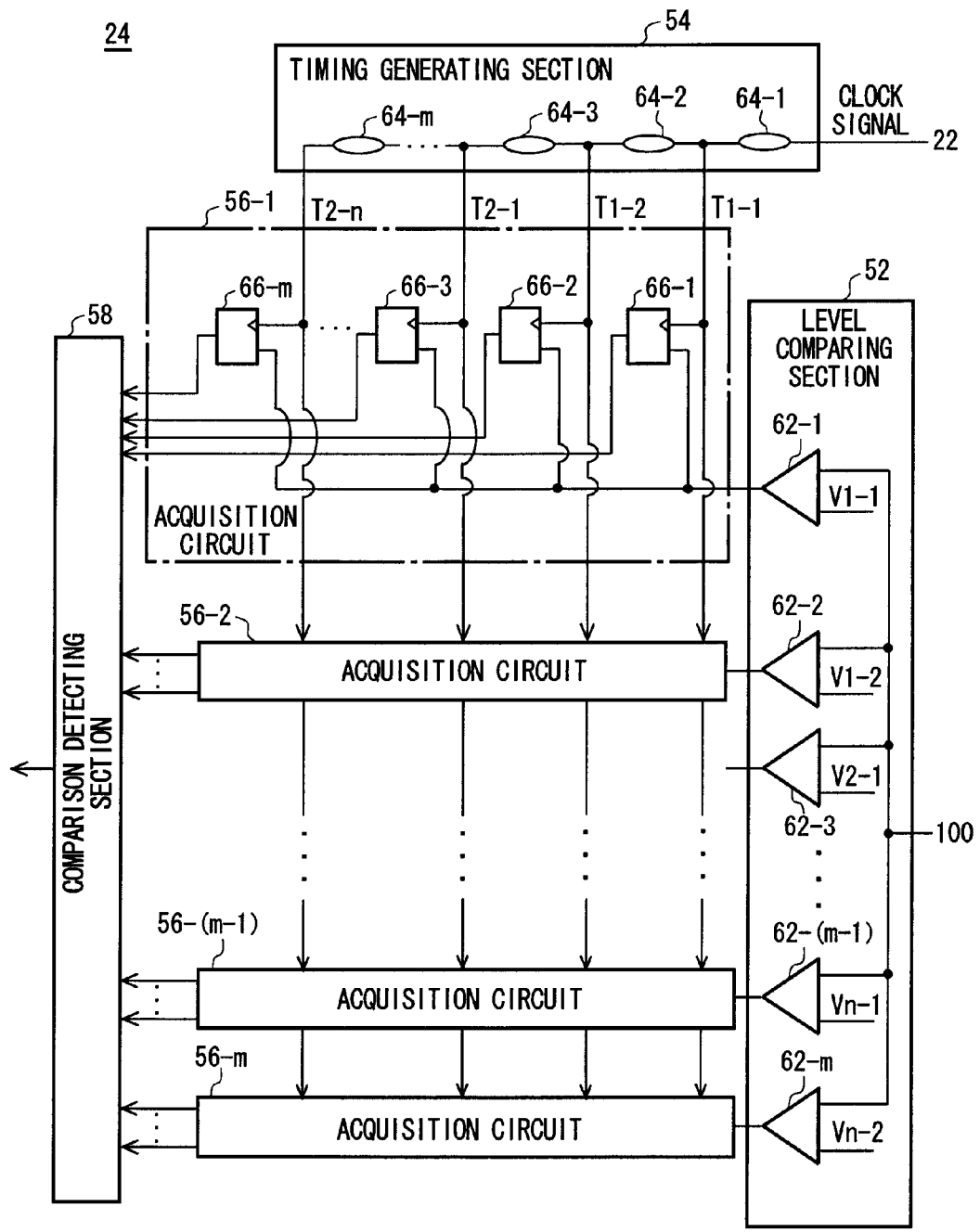
FIG. 8 shows an exemplary configuration of the amplitude and phase detecting section 24 according to the present embodiment.

FIG. 8 shows an exemplary configuration of the amplitude and phase detecting section 24 according to the present embodiment. The amplitude and phase detecting section 24 of FIG. 8 has an exemplary configuration used when the first comparison level, the second comparison level, and the comparison timings are set as shown in FIG. 7.

The amplitude and phase detecting section 24 includes a level comparing section 52, a timing generating section 54, a plurality of acquisition circuits 56-1 to 56-$m$, and a comparison detecting section 58. The level comparing section 52 compares (i) the output signal output by the device under test 100 in response to the test signal to (ii) a first comparison level and a second comparison level that are respectively less than and greater than a possible level of the output signal, for each possible level. The level comparing section 52 outputs a plurality of level comparison results between the output signal and the first and second comparison levels corresponding to each of the plurality of possible levels of the output signal.

For example, the level comparing section 52 may include a plurality of comparators 62-1 to 62-$m$, where m is an integer greater than 1, that are provided to correspond respectively to the first comparison level and the second comparison level of each of the plurality of possible levels of the output signal. The plurality of comparators 62-1 to 62-$m$ may each compare the output signal to the corresponding first comparison level or second comparison level.

The timing generating section 54 generates a plurality of timing signals that designate a first comparison timing and a second comparison timing, which are respectively earlier than and later than a possible phase of the output signal, for each of the plurality of possible phases of the output signal. For example, the timing generating section 54 may include a plurality of delay elements 64-1 to 64-$m$ that sequentially delay a clock signal.

The plurality of delay elements 64-1 to 64-$m$ are connected in series and each sequentially delay the clock signal by a preset delay amount. The delay elements 64-1 to 64-$m$ output the plurality of timing signals for designating the first comparison timing and the second comparison timing for each possible phase of the output signal.

The acquisition circuits 56-1 to 56-$m$ acquire the plurality of level comparison results from the level comparing section 52 obtained at the first comparison timing and the second comparison timing, which are respectively earlier than and later than a possible phase of the output signal, for each of the plurality of possible phases of the output signal. The acquisition circuits 56-1 to 56-$m$ are provided to correspond one-to-one with the comparators 62-1 to 62-$m$. The acquisition circuits 56-1 to 56-$m$ each include a plurality of latches 66-1 to 66-$m$ that acquire the level comparison results of the corresponding comparator 62-1 to 62-$m$.

The latches 66-1 to 66-$m$ included in each acquisition circuit 56 each acquire the level comparison result of the corresponding comparator 62 at a timing designated by a corresponding timing signal. Each acquisition circuit 56 then outputs, to the comparison detecting section 58, the level comparison results acquired by the latches 66-1 to 66-$m$ therein.

The comparison detecting section 58 detects, based on the level comparison results acquired by the acquisition circuits 56-1 to 56-$m$, a level and a transition phase that cause the output signal to be no greater than the first comparison level at the first comparison timing and to be no greater than the second comparison level and no less than the first comparison level at the second comparison timing. In other words, the comparison detecting section 58 detects the level of the received output signal and the transition phase of the received output signal. The amplitude and phase detecting section 24 having the configuration described above can detect the level and the leading edge phase of the output signal input thereto.

Instead of the above process, the level comparing section 52 may output a plurality of level comparison results obtain by comparing (i) the output signal to (ii) a fourth comparison level and a fifth comparison level that are respectively less than and greater than a possible level of the output signal, for each possible level. In this case, the level comparing section 52 may include a plurality of comparators 62-1 to 62-$m$ provided to correspond respectively to the fourth comparison level and the fifth comparison level of each of the plurality of possible levels of the output signal. The plurality of comparators 62-1 to 62-$m$ may each compare the output signal to the corresponding fourth comparison level or fifth comparison level.

Furthermore, in this case, the timing generating section 54 may generate a plurality of timing signals that designate a fourth comparison timing and a fifth comparison timing, which are respectively earlier that and later than a possible phase of the output signal, for each of the plurality of possible phases of the output signal. The acquisition circuits 56-1 to 56-$m$ acquire the plurality of level comparison results from the level comparing section 52 obtained at the fourth comparison timing and the fifth comparison timing, which are respectively earlier than and later than a possible phase of the output signal, for each of the plurality of possible phases of the output signal.

Yet further, in this case, the comparison detecting section 58 may detect, based on the level comparison results acquired by the acquisition circuits 56-1 to 56-$m$, a level and a transition phase that cause the output signal to be no greater than the fourth comparison level at the fourth comparison timing and to be no greater than the fifth comparison level and no less than the fourth comparison level at the fifth comparison timing. The amplitude and phase detecting section 24 having the configuration described above can detect the level and the trailing edge phase of the output signal input thereto.

Figure 9:
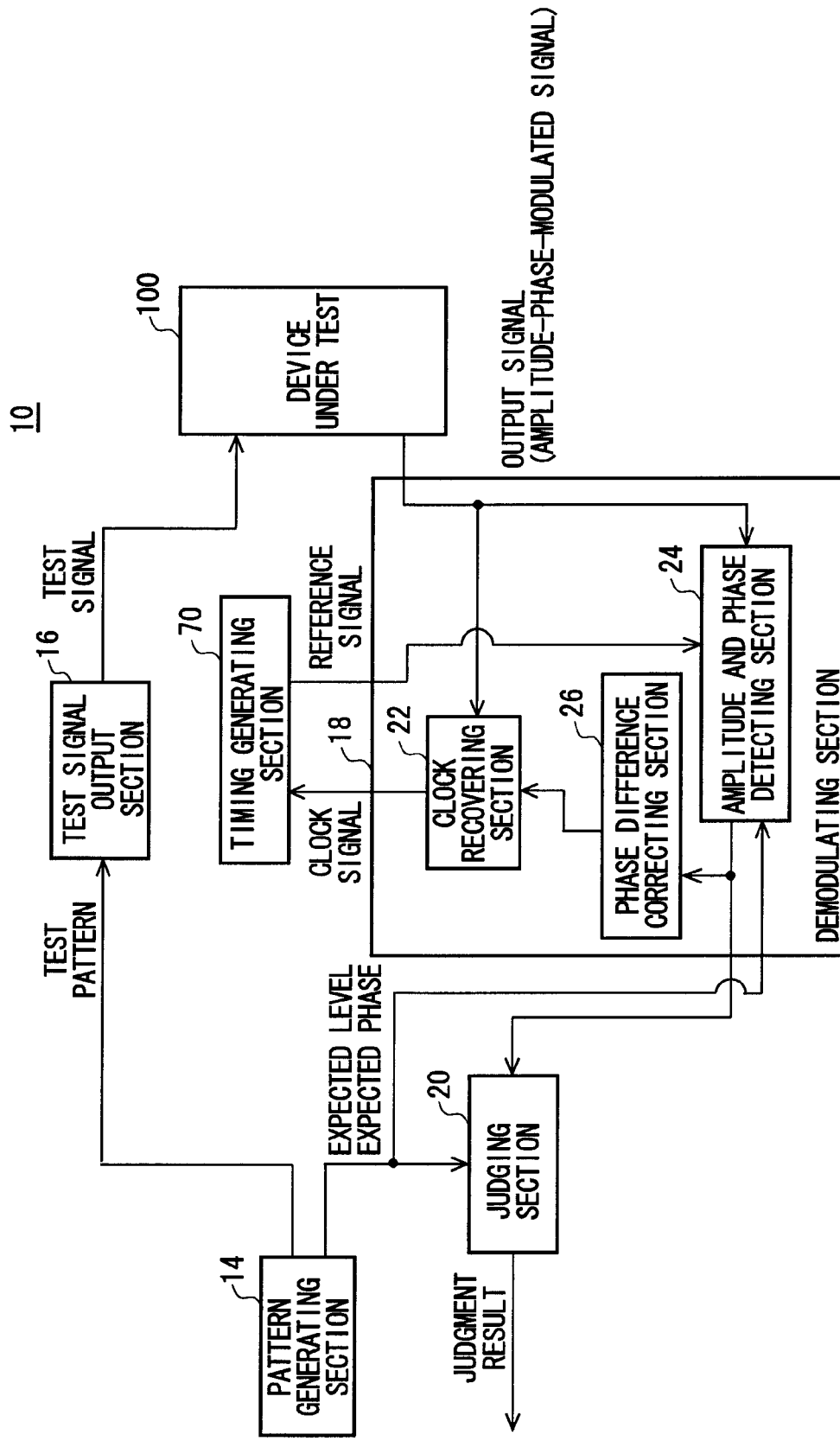
FIG. 9 shows a configuration of the test apparatus 10 according to a second modification of the present invention.

FIG. 9 shows a configuration of the test apparatus 10 according to a second modification of the present invention.

The demodulating section 18 of the present modification adopts the same function and configuration as the test apparatus 10 shown in FIGS. 1 to 9, and components of the present modification adopt the same function and configuration as components having the same reference numeral in FIGS. 1 to 9. Therefore, the following description includes only differing points.

The test apparatus 10 of the present modification is further provided with a timing generator 70. The timing generator 70 receives the clock signal recovered by the clock recovering section 22 of the demodulating section 18. The timing generator 70 generates a reference signal having a period corresponding to a test cycle, based on the clock signal.

Furthermore, in the present modification, the amplitude and phase detecting section 24 of the demodulating section 18 receives the reference signal from the timing generator 70 instead of the clock signal recovered by the clock recovering section 22. In this way, the amplitude and phase detecting section 24 of the demodulating section 18 can detect the phase and level of an amplitude-phase-modulated signal based on a reference phase determined by the test cycle.

In the present embodiment, the pattern generating section 14 generates an expected level, which is the expected value of the level of the output signal, i.e. the amplitude-phase-modulated signal, to be output from the device under test 100 in response to the test signal, and an expected phase, which is the expected transition phase of the output signal from the device under test 100, and supplies these expected values to the amplitude and phase detecting section 24. The amplitude and phase detecting section 24 compares the output signal to the first comparison level, which is less than the expected level, before the expected phase, and compares the output signal to the second comparison level and the third comparison level, which are respectively greater than and less than the expected level, after the expected phase.

The phase difference correcting section 26 corrects the phase difference supplied from the phase difference detecting section 32 to the filter section 34 in the clock recovering section 22, based on the comparison results from the amplitude and phase detecting section 24. More specifically, the phase difference correcting section 26 supplies the filter section 34 with the phase difference detected by the phase difference detecting section 32 on a condition that a mask is designated by the correction signal, and does not supply the filter section 34 with the phase difference detected by the phase difference detecting section 32 on a condition that the output signal is no greater than the first comparison level before the expected phase and is no greater than the second comparison level and no less than the third comparison level after the expected phase. In other words, the phase difference correcting section 26 supplies the filter section 34 with the phase difference detected by the phase difference detecting section 32 on a condition that the output signal matches the expected level and the expected phase, and masks the phase difference supplied from the phase difference detecting section 32 to the filter section 34 on a condition that the output signal does not match the expected level or the expected phase. Since the test apparatus 10 described above recovers the clock based on the output signal that is synchronized with the expected phase, the test apparatus 10 can output a clock signal that is accurately synchronized with the output signal.

The test apparatus 10 may be a test circuit provided to the same electronic device that the circuit under test is provided on. This test circuit may be realized as a BIST circuit or the like of the electronic device, and performs a diagnosis or the like of the electronic device by testing the circuit under test. In this way, the test circuit can check whether the circuit under test can perform the normal operations that will be required by the electronic device.

The test apparatus 10 may be a test circuit provided in the same apparatus or board that the circuit under test is provided in. This test circuit can also check whether the circuit under test can perform the normal operations that are required.

Figure 10:
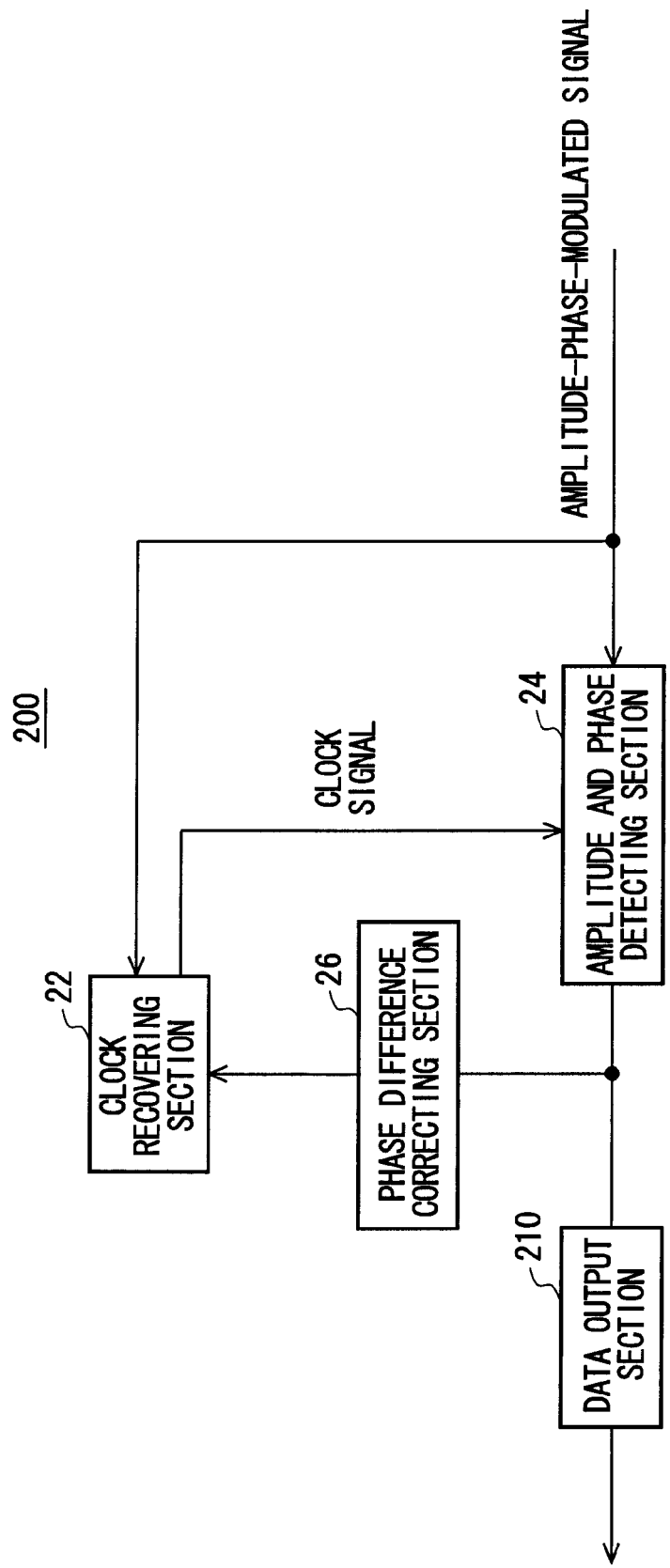
FIG. 10 shows an exemplary configuration of a demodulation apparatus 200 according to an embodiment of the present invention.

FIG. 10 shows an exemplary configuration of a demodulation apparatus 200 according to an embodiment of the present invention. The components of the demodulation apparatus 200 of the present modification adopt the same function and configuration as components having the same reference numeral in FIGS. 3 and 4. Therefore, the following description includes only differing points The demodulation apparatus 200 demodulates an amplitude-phase-modulated signal, and may be an electronic device, a module, a circuit in an electronic device, or the like. The demodulation apparatus 200 may be implemented in a semiconductor device.

The demodulation apparatus 200 is provided with the clock recovering section 22, the amplitude and phase detecting section 24, the phase difference correcting section 26, and a data output section 210. The clock recovering section 22 has the same function and configuration as the clock recovering section 22 in FIGS. 3 and 4. The amplitude and phase detecting section 24 and the phase difference correcting section 26 have the same function and configuration as the amplitude and phase detecting section 24 and the phase difference correcting section 26 in FIGS. 3 and 4.

The data output section 210 outputs data corresponding to the level and transition phase detected by the amplitude and phase detecting section 24. In other words, the data output section 210 outputs transmission data that is demodulated from the amplitude-phase-modulated signal. The demodulation apparatus 200 having the above configuration can detect the level and phase of an amplitude-phase-modulated signal input thereto, and can output transmission data corresponding to the detected level and phase.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A demodulation apparatus that demodulates an amplitude-phase-modulated signal having a level and a transition phase selected from among a plurality of levels and a plurality of phases according to transmission data, comprising:
   a clock recovering section that receives the amplitude-phase-modulated signal and recovers a clock signal synchronized with the amplitude-phase-modulated signal;
   an amplitude and phase detecting section that detects, with the clock signal as a reference, the level and the transition phase of the amplitude-phase-modulated signal;
   a data output section that outputs data corresponding to the level and the transition phase detected by the amplitude and phase detecting section; and
   a phase difference correcting section that outputs a correction signal for correcting an oscillation frequency of the clock signal output by the clock recovering section, according to the transition phase detected by the amplitude and phase detecting section.

2. The demodulation apparatus according to claim 1, wherein the clock recovering section includes:
an oscillating section that outputs the clock signal having a frequency corresponding to a control signal supplied thereto;
a phase difference detecting section that detects a phase difference between the amplitude-phase-modulated signal and the clock signal; and
a filter section that supplies the oscillating section with the control
signal corresponding to the phase difference, and
the phase difference correcting section corrects the phase difference supplied from the phase difference detecting section to the filter section, according to the transition phase detected by the amplitude and phase detecting section.

3. The demodulation apparatus according to claim 2, wherein
the phase difference correcting section supplies the filter section with the phase difference detected by the phase difference detecting section on a condition that the transition phase detected by the amplitude and phase detecting section is at least one predetermined phase from among a plurality of phases.

4. The demodulation apparatus according to claim 3, wherein
the phase difference correcting section supplies the filter section with the phase difference detected by the phase difference detecting section on a condition that the level and the transition phase detected by the amplitude and phase detecting section are each at least one predetermined level and phase from among a plurality of levels and phases.

5. The demodulation apparatus according to claim 2, further comprising a timing signal output section that generates, based on the clock signal, a plurality of timing signals corresponding respectively to a plurality of possible transition phases of the amplitude-phase-modulated signal, wherein
the phase difference correcting section selects, from among the plurality of timing signals, a timing signal corresponding to the transition phase detected by the amplitude and phase detecting section, and
the phase difference detecting section detects a phase difference between the amplitude-phase-modulated signal and the selected timing signal.

6. The demodulation apparatus according to claim 2, further comprising a timing signal output section that generates, based on the clock signal, a plurality of timing signals corresponding respectively to a plurality of possible transition phases of the amplitude-phase-modulated signal, wherein
the phase difference detecting section detects a plurality of phase differences between the amplitude-phase-modulated signal and the plurality of clock signals, and
the phase difference correcting section selects, from among the plurality of phase differences detected by the phase difference detecting section, a phase difference that corresponds to the transition phase detected by the amplitude and phase detecting section, and supplies the selected phase difference to the filter section.

7. The demodulation apparatus according to claim 2, wherein
for each of a plurality of reception points obtained respectively from a combination of a plurality of possible levels and transition phases of the amplitude-phase-modulated signal, the amplitude and phase detecting section (i) compares the amplitude-phase-modulated signal to a first comparison level, which is less than an ideal level of the reception point, at a timing before an ideal phase of the reception signal and (ii) compares the amplitude-phase-modulated signal to a second comparison level and a third comparison level, which are respectively greater than and less than the ideal level of the reception point, at a timing after the ideal phase of the reception point,
the amplitude and phase detecting section detects a level and a transition phase that cause the amplitude-phase-modulated signal to be no greater than the first comparison level at the timing before the ideal phase and to be no greater than the second comparison level and no less than the third comparison level at the timing before the ideal phase, and
the phase difference correcting section corrects the phase difference supplied from the phase difference detecting section to the filter section, according to the transition phase detected by the amplitude and phase detecting section.

8. The demodulation apparatus according to claim 2, implemented in a semiconductor device.

9. A test apparatus for testing a device under test that outputs, as an output signal, an amplitude-phase-modulated signal having a level and a transition phase selected from among a plurality of levels and a plurality of phases according to transmission data, comprising:
a test signal output section that outputs a test signal to the device under test;
a pattern generating section that generates an expected level, which is an expected value of a level of the output signal that should be output from the device under test in response to the test signal, and an expected phase, which is an expected value of a transition phase of the output signal;
a clock recovering section that receives the amplitude-phase-modulated signal from the device under test and recovers a clock signal synchronized with the amplitude-phase-modulated signal:
an amplitude and phase detecting section that detects, with the clock signal as a reference, the level and the transition phase of the output signal;
a data output section that outputs data corresponding to the level and the transition phase detected by the amplitude and phase detecting section;
a judging section that judges whether the level and the transition phase detected by the detecting section match the expected level and the expected phase; and
a phase difference correcting section that outputs a correction signal for correcting an oscillation frequency of the clock signal output by the clock recovering section, according to the transition phase detected by the amplitude and phase detecting section.

10. The test apparatus according to claim 9, wherein
the clock recovering section includes:
an oscillating section that outputs the clock signal having a frequency corresponding to a control signal supplied thereto;
a phase difference detecting section that detects a phase difference between the amplitude-phase-modulated signal and the clock signal; and
a filter section that supplies the oscillating section with the control
signal corresponding to the phase difference, and
the phase difference correcting section corrects the phase difference supplied from the phase difference detecting section to the filter section, according to the transition phase detected by the amplitude and phase detecting section.

11. The test apparatus according to claim 10, further comprising a timing generator that generates a reference signal having a period corresponding to a test cycle, based on the clock signal.

12. The test apparatus according to claim 10, further comprising a pattern generating section that generates an expected level which is an expected value of a level of the output signal that should be output from the device under test in response to the test signal, and an expected phase, which is an expected value of a transition phase of the output signal, wherein
- the amplitude and phase detecting section (i) compares the output signal to a first comparison level, which is less than the expected level, at a timing before the expected phase and (ii) compares the output signal to a second comparison level and a third comparison level, which are respectively greater and less than the expected level, at a timing after the expected phase, and
- the phase difference correcting section supplies the filter section with the phase difference detected by the phase difference detecting section on a condition that the output signal is no greater than the first comparison level at a timing before the expected phase and is no greater than the second comparison level and no less than the third comparison level at a timing after the expected phase.

13. An electronic device, comprising:
- a circuit under test that outputs, as an output signal, an amplitude-phase-modulated signal having a level and a transition phase selected from among a plurality of levels and a plurality of phases according to transmission data; and
- a test circuit that tests the circuit under test, wherein the test circuit includes:
- a test signal output section that outputs a test signal to the circuit under test;
- a pattern generating section that generates an expected level, which is an expected value of a level of the output signal that should be output from the circuit under test in response to the test signal, and an expected phase, which is an expected value of a transition phase of the output signal;
- a clock recovering section that receives the amplitude-phase-modulated signal from the circuit under test and recovers a clock signal synchronized with the amplitude-phase-modulated signal:
- an amplitude and phase detecting section that detects, with the clock signal as a reference, the level and the transition phase of the output signal;
- a judging section that judges whether the level and the transition phase detected by the detecting section match the expected level and the expected phase; and
- a phase difference correcting section that outputs a correction signal for correcting an oscillation frequency of the clock signal output by the clock recovering section, according to the transition phase detected by the amplitude and phase detecting section.

14. The electronic device according to claim 13, wherein the clock recovering section includes:
- an oscillating section that outputs the clock signal having a frequency corresponding to a control signal supplied thereto;
- a phase difference detecting section that detects a phase difference between the amplitude-phase-modulated signal and the clock signal; and
- a filter section that supplies the oscillating section with the control signal corresponding to the phase difference, and
the phase difference correcting section corrects the phase difference supplied from the phase difference detecting section to the filter section, according to the transition phase detected by the amplitude and phase detecting section.

\* \* \* \* \*